United States Patent [19]

Kono et al.

[11] Patent Number: 5,604,077
[45] Date of Patent: Feb. 18, 1997

[54] POSITIVE-WORKING PHOTORESIST COMPOSITION COMPRISING A NOVOLAC RESIN MADE IN BUTYROLACTONE AS A SOLVENT

[75] Inventors: Shinichi Kono; Hayato Ohno; Hidekatsu Kohara; Toshimasa Nakayama, all of Kanagawa-ken, Japan

[73] Assignee: Tokyo Ohka Kogyo Co., Ltd., Japan

[21] Appl. No.: 603,601

[22] Filed: Feb. 21, 1996

[30] Foreign Application Priority Data

Feb. 24, 1995 [JP] Japan .................. 7-037308

[51] Int. Cl.$^6$ .................................. G03F 7/023
[52] U.S. Cl. ................ 430/192; 430/191; 430/193; 528/137
[58] Field of Search .................. 430/165, 192, 430/193, 191; 528/137

[56] References Cited

U.S. PATENT DOCUMENTS

| | | | |
|---|---|---|---|
| 4,575,480 | 3/1986 | Kotani et al. | 430/192 |
| 4,959,292 | 9/1990 | Blakeney et al. | 430/193 |
| 4,971,887 | 11/1990 | Schmitt et al. | 430/193 |
| 5,182,184 | 1/1993 | Lazarus et al. | 430/165 |
| 5,340,686 | 8/1994 | Sakaguchi et al. | 430/192 |
| 5,395,727 | 3/1995 | Uetani et al. | 430/192 |

FOREIGN PATENT DOCUMENTS 62-172341  7/1987  Japan .

*Primary Examiner*—John S. Chu
*Attorney, Agent, or Firm*—Wenderoth, Lind & Ponack

[57] ABSTRACT

Proposed is an improved positive-working photoresist composition for use in the photolithographic patterning works for the manufacture of semiconductor devices, which is capable of giving a patterned resist layer on a substrate surface having excellent resolution and heat resistance without formation of scum in the development treatment. The photoresist composition comprises: (a) an alkali-soluble novolac resin as a film-forming ingredient and (b) a naphthoquinone diazide group-containing compound as a photosensitizing ingredient, of which the novolac resin is a condensation product of a phenolic compound and an aldehyde compound, the condensation reaction being undertaken in a solvent system containing, in addition to water, γ-butyrolactone or a combination of γ-butyrolactone and a propyleneglycol monoalkyl ether in a limited proportion.

5 Claims, No Drawings

POSITIVE-WORKING PHOTORESIST COMPOSITION COMPRISING A NOVOLAC RESIN MADE IN BUTYROLACTONE AS A SOLVENT

BACKGROUND OF THE INVENTION

The present invention relates to a novel positive-working photoresist composition or, more particularly, to a positive-working photoresist composition capable of giving a patterned resist layer having excellent heat resistance and pattern resolution without the disadvantage of scum formation in the development to be suitable for use in the photolithographic patterning works in the manufacturing process of semiconductor devices in which extreme fineness of patterning is essential.

Photoresist compositions used in the photolithographic patterning works in the manufacturing process of semiconductor devices are classified into positive-working and negative-working photoresist compositions, of which positive-working photoresist compositions compounded with an alkali-soluble novolac resin as a film-forming ingredient and a quinone diazide group-containing compound as a photosensitive ingredient are preferred in the manufacturing process of printed circuit boards and semiconductor devices in respect of the high resolution of patterning as compared with negative-working photoresist compositions.

As a remarkable trend in the semiconductor devices in recent years, the degree of integration in the devices such as ICs, LSIs and the like is increasing year by year so that the fineness of photolithographic patterning must be so fine in the half-micron order to the quarter-micron order. Along with the trend toward extreme fineness of the photolithographic patterning, the major current of the etching process for the pattern-wise etching of the substrate surface with the patterned resist layer as a protective masking layer is the dry etching process undertaken at an elevated temperature so that the patterned resist layer formed from a positive-working photoresist composition is strongly required to be highly resistant against etching or, namely, to have high heat resistance in addition to the requirement for a high resolution in patterning.

Another requirement for a positive-working photoresist composition to comply with the recent trend toward increased fineness in patterning is that the patterned resist layer after the development treatment is absolutely free from occurrence of scum or residue of the resist layer because even a trace amount of scum seriously affects the quality of the patterned resist layer.

In view of the above described requirements for a positive-working photoresist composition, various proposals and attempts have been made heretofore for the improvement thereof. As an approach therefor, improvements have been proposed for the quality of the alkali-soluble novolac resins compounded in the positive-working photoresist compositions. For example, Japanese Patent Kokai 62-172341 proposes a novolac resin for positive-working photoresist compositions which is prepared by the condensation reaction of a cresol mixture and formaldehyde with oxalic acid as the catalyst in the presence of a good solvent for novolac resins such as 2-ethoxyethyl alcohol, methyl isobutyl ketone, ethyleneglycol monoethyl ether acetate, propyleneglycol monomethyl ether acetate and the like. Though excellent in the photosensitivity, the positive-working photoresist composition prepared by compounding this novolac resin is not fully practicable because the patterned resist layer formed therefrom is not highly resistant against heat and not free from occurrence of scum.

It is known that the heat resistance of the patterned resist layer formed from a positive-working photoresist composition can be improved by fractionating the novolac resin as the principal ingredient thereof to be freed from low molecular weight species but the fractionating treatment of the novolac resin requires an additional step in the preparation of the photoresist composition and is unfavorable against stabilization of the preparation process of the photoresist compositions.

SUMMARY OF THE INVENTION

The present invention accordingly has an object, in view of the above described problems and defects in the conventional positive-working photoresist compositions, to provide a positive-working photoresist composition capable of giving a patterned resist layer having excellent heat resistance and pattern resolution and substantially free from the disadvantage of scum formation in the development.

Namely, the positive-working photoresist composition provided by the invention is a uniform blend which comprises:

(a) 100 parts by weight of an alkali-soluble novolac resin having a weight-average molecular weight in the range from 2,000 to 15,000; and (b) from 10 to 40 parts by weight of a quinone diazide group-containing compound, the alkali-soluble novolac resin being a product by a condensation reaction between a phenolic compound and an aldehyde compound with an acid as the catalyst undertaken in a solvent system comprising γ-butyrolactone or a combination of γ-butyrolactone and a propyleneglycol monoalkyl ether.

DETAILED DESCRIPTION OF THE PREFERRED EMBODIMENTS

As is described above, the most characteristic feature of the inventive positive-working photoresist composition consists in the use of a specific alkali-soluble novolac resin which is a product of the condensation reaction between a phenolic compound and an aldehyde compound undertaken under unique conditions relative to the composition of the solvent system in which the condensation reaction is performed. This invention has been completed as a result of the extensive investigations undertaken by the inventors with an object to obtain a positive-working photoresist composition capable of satisfying the above described requirements directing their attention to the problem that the nature of the solvent system in which the condensation reaction between a phenolic compound and an aldehyde compound is performed may have an influence on the properties of the novolac resin prepared thereby and hence on the performance of the photoresist composition compounded therewith.

The alkali-soluble novolac resin as the film-forming ingredient in the positive-working photoresist composition is essentially a product obtained by the condensation reaction between a phenolic compound and an aldehyde compound with an acid as the catalyst undertaken in a specific solvent system which comprises γ-butyrolactone or a combination of γ-butyrolactone and a propyleneglycol monoalkyl ether. The above mentioned phenolic compound is exemplified by o-, m- and p-cresols, o-, m- and p-ethyl phenols, o-, m- and p-butyl phenols, 2,3-, 2,4-, 2,5-, 2,6- , 3,4- and 3,5-xylenols, p-phenylphenol, 2,3,5-trimethyl phenol, hydroquinone, catechol, resorcinol, 2-methylresorcinol, pyrogallol, α-naphthol, bisphenol A, dihydroxy benzoic acid esters, gallic acid esters, of which o-, m- and p-cresols, 2,5- and 3,5-xylenols and 2,3,5-trimethyl phenol are preferred. These phenolic compounds can be used either singly or as a combination of two kinds or more according to need.

On the other hand, the aldehyde compound to pertain to the condensation reaction with the phenolic compound is exemplified by formaldehyde, paraformaldehyde, acetaldehyde, propionaldehyde, benzaldehyde, phenyl acetaldehyde, α- and β-phenyl propionaldehydes, o-, m- and p-hydroxy benzaldehydes, o-, m- and p-chloro benzaldehydes, o-, m- and p-nitro benzaldehydes, o-, m- and p-methyl benzaldehydes and p-ethyl benzaldehyde, of which formaldehyde, acetaldehyde and benzaldehyde are preferred. Formalin as an aqueous solution of formaldehyde is most preferable in respects of the good availability and inexpensiveness. These aldehyde compounds can be used either singly or as a combination of two kinds or more according to need. The amount of the aldehyde compound used in the condensation reaction is in the range from 0.5 to 4.0 moles or, preferably, from 0.7 to 3.0 moles per mole of the phenolic compound.

Suitable acids as the catalyst to promote the condensation reaction between the phenolic compound and the aldehyde compound include inorganic acids such as hydrochloric and sulfuric acids and organic acids such as formic, oxalic and acetic acids, of which oxalic acid is preferred. The amount of the acid used as the catalyst in the condensation reaction is preferably in the range from 0.1 mmole to 500 mmoles per mole of the phenolic compound. It is advantageous to use the acid in the form of an aqueous solution in order to ensure homogeneity and high efficiency of the condensation reaction.

It is essential according to the invention that the condensation reaction between the phenolic compound and the aldehyde compound with an acid as the catalyst is undertaken in a solvent system containing γ-butyrolactone or a combination of γ-butyrolactone and a propyleneglycol monoalkyl ether. The amount of γ-butyrolactone or a combination of γ-butyrolactone and a propyleneglycol monoalkyl ether in the solvent system is in the range from 10 to 1000 parts by weight per 100 parts by weight of the total amount of the phenolic compound and the aldehyde compound. The condensation reaction is performed at a temperature, usually, in the range from 10° to 200° C. or, preferably, in the range from 50° to 150° C. though dependent on the kinds of the phenolic compound and aldehyde compound. It is of course that the solvent system may contain water as a constituent thereof which can be introduced as a solvent of the aldehyde compound, i.e. water in formalin, or as a solvent of the acid catalyst or can be introduced separately.

Since γ-butyrolactone has a relatively high boiling point of 203° to 204° C., addition thereof to the solvent system may cause a difficulty in controlling the reaction temperature within the above mentioned preferable range if the reaction is to be performed under reflux of the solvents and decomposition of the catalyst such as oxalic acid is to be avoided. This difficulty can be mitigated by the addition of water to the solvent system. The amount of water added to the solvent system should not exceed 50 parts by weight or, preferably, 40 parts by weight per 100 parts by weight of γ-butyrolactone since an excessively large amount of water may cause prolongation of the reaction time.

When the solvent system for the condensation reaction of a phenolic compound and an aldehyde compound contains γ-butyrolactone and a propyleneglycol monoalkyl ether in combination, the amount of the γ-butyrolactone is at least 20% by weight or, preferably, at least 50% by weight based on the total amount of these two solvents in respect of the shorter reaction time and the superior properties of the photoresist composition compounded with the novolac resin prepared thereby relative to the amount of scum in development and heat resistance of the patterned resist layer. Examples of suitable propyleneglycol monoalkyl ethers include propyleneglycol monomethyl ether, propyleneglycol monoethyl ether, propyleneglycol monopropyl ether and propyleneglycol monobutyl ether, of which propyleneglycol monomethyl ether and propyleneglycol monopropyl ether are preferred. It is of course optional that the solvent system comprising γ-butyrolactone and a propyleneglycol monoalkyl ether in combination is further admixed with water, if necessary.

The alkali-soluble novolac resin prepared in the above described manner is advantageous as the film-forming ingredient in a photoresist composition as compared with those conventional alkali-soluble novolac resins because the content of low molecular weight species in the resin is low and the molecular weight distribution thereof is narrow so as to impart the patterned resist layer with increased heat resistance. Accordingly, it is not always necessary to subject the novolac resin as prepared to a fractionating treatment to remove the low molecular weight fractions before compounding in a photoresist composition although it is of course desirable to undertake a fractionating treatment in order to accomplish further improvements in respect of the heat resistance and resolution of the patterned resist layer and decrease of scum formation. The alkali-soluble novolac resin to be compounded in a photoresist composition should have a weight-average molecular weight in the range from 2,000 to 15,000 or, preferably, from 4,000 to 10,000.

The quinone diazide group-containing compound as the other essential ingredient in the inventive positive-working photoresist composition is exemplified by those partial or full esterification products or partial or full amidation products between a sulfonic acid of a quinone diazide compound such as o-benzoquinone diazide, o-naphthoquinone diazide, o-anthraquinone diazide and the like with a compound having phenolic hydroxy groups or amino groups.

Examples of the above mentioned phenolic hydroxy group-containing compound include: polyhydroxy benzophenone compounds such as 2,3,4,4'-tetrahydroxy benzophenone, 2,2',4,4'-tetrahydroxy benzophenone, 2,3,4-trihydroxy benzophenone and the like; methyl-substituted or unsubstituted tris(hydroxyphenyl) methane compounds such as 1-[1-(4-hydroxy phenyl)isopropyl]-4-[1,1-bis(4-hydroxy phenyl)ethyl] benzene, tris(4-hydroxyphenyl) methane, bis(4-hydroxy-3,5-dimethylphenyl)-4-hydroxyphenyl) methane, bis(4-hydroxy-2,5-dimethylphenyl)-4-hydroxyphenyl methane, bis(4-hydroxy-3,5-dimethylphenyl)-2-hydroxyphenyl methane, bis(4-hydroxy-2,5-dimethylphenyl)-2-hydroxyphenyl methane and the like; methyl-substituted or unsubstituted bis(cyclohexyl hydroxy phenyl)-methane compounds such as bis(3-cyclohexyl-4-hydroxy phenyl)3-hydroxyphenyl methane, bis(3-cyclohexyl-4-hydroxy phenyl)-2-hydroxyphenyl methane, bis(3-cyclohexyl-4-hydroxy phenyl)-4-hydroxyphenyl methane, bis(5-cyclohexyl-4-hydroxy-2-methyl-phenyl)-2-hydroxyphenyl methane, bis(5-cyclohexyl-4-hydroxy-2-methylphenyl)-3-hydroxyphenyl methane, bis(5-cyclohexyl-4-hydroxy-2-methylphenyl)-4-hydroxyphenyl methane, bis(3-cyclohexyl-2-hydroxy phenyl)-3-hydroxyphenyl methane, bis(3-cyclohexyl-2-hydroxy phenyl)-2-hydroxyphenyl methane, bis(3-cyclohexyl-2-hydroxy phenyl)-4-hydroxyphenyl methane, bis(5-cyclohexyl-2-hydroxy-4-methylphenyl)-2-hydroxyphenyl methane, bis(5-cyclohexyl-2-hydroxy-4-methylphenyl)-4-hydroxyphenyl methane and the like; and other compounds having one or more of hydroxy or amino groups in a molecule such as phenol, phenolic resins, p-methoxy phenol, hydroquinone, bisphenol A, polyhydroxy diphenylalkanes, polyhydroxy diphenylalkenes, naphthols, pyrocatechol, pyrogallol, pyrogallol monomethyl ethers, pyrogallol 1,3-dimethyl ether, gallic acid, partial esterification or etherification products of gallic acid, aniline, di(p-aminophenyl) amine and the like. Those particularly preferable among the above named compounds are full esterification products of a polyhydroxy benzophenone and naphthoquinone-1,2-diazide-5- or naphthoquinone-1,2-diazide-4-sulfonic acid and similar partial esterification products of which the degree of esterification is at least 70%. These quinone diazide group-containing compounds as the photosensitizing agent are used either singly or as a combination of two kinds or more.

The amount of the above described photosensitizing agent in the inventive photoresist composition is preferably in the range from 10 to 40 parts by weight or, more preferably, from 15 to 30 parts by weight per 100 parts by weight of the alkali-soluble novolac resin. When the amount of the photosensitizing agent is too small, patterned resist layers having a good cross sectional profile cannot be obtained from the photoresist composition while, when the amount thereof is too large, the photoresist composition cannot be imparted with sufficiently high photosensitivity.

The positive-working photoresist composition of the invention is used usually in the form of a solution prepared by dissolving the alkali-soluble novolac resin and the quinone diazide group-containing compound in a suitable organic solvent which is exemplified by methyl lactate, ethyl lactate, methyl acetate, ethyl acetate, butyl acetate, methyl pyruvate, ethyl pyruvate, methyl 3-methoxypropionate and ethyl 3-ethoxy-propionate, monomethyl and monoethyl ethers of ethyleneglycol, monomethyl and monoethyl ethers of propyleneglycol, ethyleneglycol monomethyl ether acetate, ethyleneglycol monoethyl ether acetate, propyleneglycol monomethyl ether acetate, propyleneglycol monoethyl ether acetate, diethyleneglycol monomethyl ether, diethyleneglycol monoethyl ether and diethyleneglycol monomethyl ether acetate. These organic solvents can be used either singly or as a mixture of two kinds or more according to need.

It is of course optional according to need that the positive-working photoresist composition of the invention is admixed, besides the alkali-soluble novolac resin and the quinone diazide group-containing compound, with various kinds of additives including, for example, auxiliary resins, plasticizers, stabilizers and the like to improve the properties of the resist film, coloring agents to improve visibility of the patterned resist layer after development, auxiliary sensitizing agents to increase the photosensitivity of the photoresist composition, contrast improvers, surface active agents and so on conventionally used in photoresist compositions each in a limited amount.

To explain the way for the photolithographic patterning work by using the inventive photoresist composition, a solution as the photoresist composition prepared by dissolving the above described alkali-soluble novolac resin, quinone diazide group-containing compound and optional additives in an organic solvent is uniformly applied to the surface of a substrate on a suitable coating machine such as spinners followed by drying to form a photoresist layer which is irradiated pattern-wise with actinic rays such as ultraviolet light, far ultraviolet light and the like through a pattern-bearing transparency called a photomask on a minifying projection exposure machine, excimer laser beams or X-rays through a mask or electron beams under scanning to form a latent image of the pattern. Thereafter, the resist layer on the substrate is immersed in an aqueous alkaline solution such as an aqueous solution of tetramethyl ammonium hydroxide in a concentration of 1 to 10% by weight so that the latent image is developed by the selective removal of the resist layer in the areas exposed to the actinic rays where the resist layer is imparted with increased solubility in the aqueous alkaline solution to give a patterned resist layer.

In the following, the positive-working photoresist composition of the present invention is described in more detail by way of examples, which, however, never limit the scope of the invention in any way. In the following examples, each of the photoresist compositions was evaluated for the items given below by the testing procedures described there.

(1) Heat resistance

A line-wise patterned resist layer having a line width of 5 μm was formed on a semiconductor silicon wafer, which was baked on a hot plate kept at a step-wise increased temperature of 125° C. to 145° C. by 5° C. increments to keep the silicon wafer for 5 minutes at each temperature followed by inspection of the patterned resist layer to record the lowest temperature at which deformation of the resist pattern took place.

(2) Resolution

Test patterning of the resist layer was conducted for the reproduction of a line-and-space pattern of varied line widths to record the smallest line width resolved at an exposure dose capable of resolving a pattern of 0.6 μm line width.

(3) Scum formation

A silicon wafer coated with the photoresist composition as the sample uniformly on a spinner was heated on a hot plate at 90° C. for 90 seconds to dry the coating layer and the thus formed resist layer having a thickness of 1.05 μm was exposed pattern-wise to ultraviolet light on a minilying projection exposure machine (Model NSR-2005i10DE manufactured by Nikon Co.) followed by development of the resist layer in a 2.38% aqueous solution of tetramethyl ammonium hydroxide at 23° C. for 60 seconds followed by rinse with water for 30 seconds and drying to form a patterned resist layer of a line-and space pattern having a line width of 0.6 μm which was examined with an electron microscope to detect occurrence of scum, i.e. residue of the resist layer, in the line parts and space parts to record the results as Poor and Good when generation of scum was found or not, respectively.

PREPARATION EXAMPLE 1

Into a four-necked flask of 5 liters capacity were introduced 650 g of m-cresol, 540 g of 2,3,5-trimethyl phenol, 60 g of deionized water, 15 g of anhydrous oxalic acid and 179 g of γ-butyrolactone to form a mixture which was heated under agitation for 30 minutes at 120° C. Thereafter, the mixture in the flask was kept at 100° C. and 730 g of 35% formalin, i.e. 35% by weight aqueous solution of formaldehyde, were introduced thereinto drop-wise over a period of 45 minutes followed by continued agitation of the mixture for 5 hours under reflux to effect the condensation reaction. After cooling, the reaction mixture was admixed with 180 g of deionized water followed by standing as such for 30 minutes to cause phase separation into the upper layer of the reaction medium and the lower layer of a resinous matter as the novolac resin, the amount of which was about 1000 g. The novolac resin, referred to as the novolac A hereinafter, had a weight-average molecular weight of 6,000.

The above obtained novolac resin was subjected to the test of solubility in an aqueous alkaline solution. Thus, a 25% by weight solution of the resin in ethyleneglycol monoethyl ether acetate was applied uniformly to the surface of a semiconductor silicon wafer of 3 inches diameter on a spinner followed by drying at 110° C. for 90 seconds to form a 1.0 μm thick layer of the resin.

The silicon wafer having the resin layer was immersed in a 2.38% aqueous solution of tetramethyl ammonium hydroxide at 23° C. to record the length of time taken for complete removal of the resin layer from the substrate surface by dissolving away, which was 42 seconds in this case.

PREPARATION EXAMPLE 2

A novolac resin, referred to as the novolac B hereinafter, was prepared by subjecting the novolac A to a fractionating treatment. Thus, 200 g of the novolac A were dissolved in 533 g of butyl acetate with agitation for 30 minutes to give a solution followed by the addition of 1200 g of n-heptane thereto with agitation to precipitate the resin in the lower layer by phase separation to obtain 100 g of a fractionated novolac resin after removal of the low molecular weight fractions.

PREPARATION EXAMPLE 3

A novolac resin, referred to as the novolac C, was prepared in the following manner. Thus, 140 g of m-cresol, 68 g of 3,4-xylenol, 10 g of deionized water, 5 g of anhydrous oxalic acid and 79 g of γ-butyrolactone were introduced into a four-necked flask of 1 liter capacity to form a mixture which was agitated for 30 minutes at 120° C. Thereafter, the mixture in the flask was kept at 100° C. and 120 g of 35% formalin were introduced thereinto drop-wise over a period of 45 minutes followed by continued agitation of the mixture for 5 hours under reflux to effect the condensation reaction. After cooling, the reaction mixture was admixed with 180 g of deionized water followed by standing as such for 30 minutes to cause phase separation into the upper layer of the reaction medium and the lower layer of a resinous matter as the novolac resin, the amount of which was about 200 g. The novolac resin had a weight-average molecular weight of 5,000. The alkali-dissolvability of the novolac resin was 37 seconds as determined in the same manner as in Preparation Example 1.

The above obtained novolac resin was subjected to the fractionating treatment in just the same way as in Preparation Example 2 to give a fractionated novolac resin which is referred to as the novolac C hereinafter.

PREPARATION EXAMPLE 4

A novolac resin, referred to as the novolac D, was prepared in the following manner. Thus, 140 g of m-cresol, 68 g of 3,4-xylenol, 10 g of deionized water, 5 g of anhydrous oxalic acid and 79 g of 2-ethoxyethyl alcohol were introduced into a four-necked flask of 1 liter capacity to form a mixture which was agitated for 30 minutes at 120° C. Thereafter, the mixture in the flask was kept at 100° C. and 120 g of 35% formalin were introduced thereinto drop-wise over a period of 45 minutes followed by continued agitation of the mixture for 5 hours under reflux to effect the condensation reaction. After cooling, the reaction mixture was admixed with 180 g of deionized water followed by standing as such for 30 minutes to cause phase separation into the upper layer of the reaction medium and the lower layer of a resinous matter as the novolac resin, the amount of which was about 200 g. The novolac resin had a weight-average molecular weight of 5,000. The alkali-dissolvability of the novolac resin was 58 seconds as determined in the same manner as in Preparation Example 1.

The above obtained novolac resin was subjected to the fractionating treatment in just the same way as in Preparation Example 2 to give a fractionated novolac resin which is referred to as the novolac D hereinafter.

PREPARATION EXAMPLE 5

A novolac resin, referred to as the novolac E, was prepared in the following manner. Thus, 162 g of m-cresol, 46 g of 2,5-xylenol, 10 g of deionized water, 5 g of anhydrous oxalic acid and 79 g of γ-butyrolactone were introduced into a four-necked flask of 1 liter capacity to form a mixture which was agitated for 30 minutes at 120° C. Thereafter, the mixture in the flask was kept at 100° C. and 120 g of 35% formalin were introduced thereinto drop-wise over a period of 45 minutes followed by continued agitation of the mixture for 5 hours under reflux to effect the condensation reaction. After cooling, the reaction mixture was admixed with 180 g of deionized water followed by standing as such for 30 minutes to cause phase separation into the upper layer of the reaction medium and the lower layer of a resinous matter as the novolac resin, the amount of which was about 200 g. The novolac resin had a weight-average molecular weight of 4,600. The alkali-dissolvability of the novolac resin was 40 seconds as determined in the same manner as in Preparation Example 1.

The above obtained novolac resin was subjected to the fractionating treatment in just the same way as in Preparation Example 2 to give a fractionated novolac resin which is referred to as the novolac E hereinafter.

PREPARATION EXAMPLE 6

A novolac resin, referred to as the novolac F, was prepared in the following manner. Thus, 109 g of m-cresol, 63 g of 2,5-xylenol, 70 g of 3,4-xylenol, 10 g of deionized water, 5 g of anhydrous oxalic acid and 79 g of γ-butyrolactone were introduced into a four-necked flask of 1 liter capacity to form a mixture which was agitated for 30 minutes at 120° C. Thereafter, the mixture in the flask was kept at 100° C. and 120 g of 35% formalin were introduced thereinto drop-wise over a period of 45 minutes followed by continued agitation of the mixture for 5 hours under reflux to effect the condensation reaction. After cooling, the reaction mixture was admixed with 180 g of deionized water followed by standing as such for 30 minutes to cause phase separation into the upper layer of the reaction medium and the lower layer of a resinous matter as the novolac resin, the amount of which was about 200 g. The novolac resin had a weight-average molecular weight of 4,600. The alkali-dissolvability of the novolac resin was 40 seconds as determined in the same manner as in Preparation Example 1.

The above obtained novolac resin was subjected to the fractionating treatment in just the same way as in Preparation Example 2 to give a fractionated novolac resin which is referred to as the novolac F hereinafter.

PREPARATION EXAMPLE 7

A novolac resin, referred to as the novolac G, was prepared in the following manner. Thus, 140 g of m-cresol, 68 g of 3,4-xylenol, 10 g of deionized water, 5 g of anhydrous oxalic acid and 79 g of methyl isobutyl ketone were introduced into a four-necked flask of 1 liter capacity to form a mixture which was agitated for 30 minutes at 120° C. Thereafter, the mixture in the flask was kept at 100° C. and 120 g of 35% formalin were introduced thereinto drop-wise over a period of 45 minutes followed by continued agitation of the mixture for 5 hours under reflux to effect the condensation reaction. After cooling, the reaction mixture was admixed with 180 g of deionized water followed by standing as such for 30 minutes to cause phase separation into the upper layer of the reaction medium and the lower layer of a resinous matter as the novolac resin, the amount of which was about 200 g. The novolac resin had a weight-average molecular weight of 6,600. The alkali-dissolvability of the novolac resin was 60 seconds as determined in the same manner as in Preparation Example 1.

The above obtained novolac resin was subjected to the fractionating treatment in just the same way as in Preparation Example 2 to give a fractionated novolac resin which is referred to as the novolac G hereinafter.

PREPARATION EXAMPLE 8

A novolac resin, referred to as the novolac H, was prepared in the following manner. Thus, 650 g of m-cresol, 65 g of p-cresol, 133 g of 2,3,5-trimethyl phenol, 5 g of anhydrous oxalic acid, 160 g of γ-butyrolactone and 40 g of propyleneglycol monopropyl ether were introduced into a four-necked flask of 5 liter capacity to form a mixture which was agitated for 30 minutes at 120° C. Thereafter, the mixture in the flask was kept at 100° C. and 730 g of 35% formalin were introduced thereinto drop-wise over a period of 45 minutes followed by continued agitation of the mixture for 5 hours under reflux to effect the condensation reaction. After cooling, the reaction mixture was admixed with 180 g of deionized water followed by standing as such for 30 minutes to cause phase separation into the upper layer of the reaction medium and the lower layer of a resinous matter as the novolac resin, the amount of which was about 200 g. The novolac resin had a weight-average molecular weight of 7,200. The alkali-dissolvability of the novolac resin was 26 seconds as determined in the same manner as in Preparation Example 1.

The above obtained novolac resin was subjected to the fractionating treatment in just the same way as in Preparation Example 2 to give a fractionated novolac resin which is referred to as the novolac H hereinafter.

PREPARATION EXAMPLE 9

A novolac resin, referred to as the novolac I, was prepared in the following manner. Thus, 650 g of m-cresol, 128 g of 3,4-xylenol, 65 g of 2,3,5-trimethyl phenol, 15 g of anhydrous oxalic acid, 90 g of γ-butyrolactone and 90 g of propyleneglycol monopropyl ether were introduced into a four-necked flask of 5 liter capacity to form a mixture which was agitated for 30 minutes at 120° C. Thereafter, the mixture in the flask was kept at 100° C. and 730 g of 35% formalin were introduced thereinto drop-wise over a period of 45 minutes followed by continued agitation of the mixture for 7 hours under reflux to effect the condensation reaction. After cooling, the reaction mixture was admixed with 180 g of deionized water followed by standing as such for 30 minutes to cause phase separation into the upper layer of the reaction medium and the lower layer of a resinous matter as the novolac resin, the amount of which was about 200 g. The novolac resin had a weight-average molecular weight of 4,500. The alkali-dissolvability of the novolac resin was 21 seconds as determined in the same manner as in Preparation Example 1.

The above obtained novolac resin was subjected to the fractionating treatment in just the same way as in Preparation Example 2 to give a fractionated novolac resin which is referred to as the novolac I hereinafter.

PREPARATION EXAMPLE 10

A novolac resin, referred to as the novolac J, was prepared in the following manner. Thus, 100 g of m-cresol, 23 g of 3,4-xylenol, 12 g of 2,5-xylenol, 10 g of anhydrous oxalic acid, 32 g of γ-butyrolactone and 48 g of propyleneglycol monomethyl ether were introduced into a four-necked flask of 1 liter capacity to form a mixture which was agitated for 30 minutes at 120° C. Thereafter, the mixture in the flask was kept at 100° C. and 120 g of 35% formalin were introduced thereinto drop-wise over a period of 45 minutes followed by continued agitation of the mixture for 7 hours under reflux to effect the condensation reaction. After cooling, the reaction mixture was admixed with 180 g of deionized water followed by standing as such for 30 minutes to cause phase separation into the upper layer of the reaction medium and the lower layer of a resinous matter as the novolac resin, the amount of which was about 200 g. The novolac resin had a weight-average molecular weight of 5,300. The alkali-dissolvability of the novolac resin was 45 seconds as determined in the same manner as in Preparation Example 1.

The above obtained novolac resin was subjected to the fractionating treatment in just the same way as in Preparation Example 2 to give a fractionated novolac resin which is referred to as the novolac J hereinafter.

PREPARATION EXAMPLE 11

A novolac resin, referred to as the novolac K, was prepared in the following manner. Thus, 140 g of m-cresol, 42 g of p-cresol, 48 g of 2,5-xylenol, 5 g of anhydrous oxalic acid, 9.5 g of deionized water and 81 g of propyleneglycol monomethyl ether were introduced into a four-necked flask of 1 liter capacity to form a mixture which was agitated for 30 minutes at 120° C. Thereafter, the mixture in the flask was kept at 100° C. and 120 g of 35% formalin were introduced thereinto drop-wise over a period of 45 minutes followed by continued agitation of the mixture for 19 hours under reflux to effect the condensation reaction. After cooling, the reaction mixture was admixed with 180 g of deionized water followed by standing as such for 30 minutes to cause phase separation into the upper layer of the reaction medium and the lower layer of a resinous matter as the novolac resin, the amount of which was about 200 g. The novolac resin had a weight-average molecular weight of 6,200. The alkali-dissolvability of the novolac resin was 59 seconds as determined in the same manner as in Preparation Example 1.

The above obtained novolac resin was subjected to the fractionating treatment in just the same way as in Preparation Example 2 to give a fractionated novolac resin which is referred to as the novolac K hereinafter.

EXAMPLES 1 TO 8

In each of Examples 1 to 8, a positive-working photoresist composition was prepared by dissolving 100 parts by weight of the novolac resin A, B, C, E, F, H, I or J prepared in Preparation Example 1, 2, 3, 5, 6, 8, 9 or 10, respectively, and 30 parts by weight of an esterification product obtained from 1 mole of 2,3,4,4'-tetrahydroxy benzophenone and 3 moles of naphthoquinone-1,2-diazide-5-sulfonyl chloride in a solvent mixture of 360 parts of ethyl lactate and 40 parts by weight of butyl acetate followed by filtration of the solution through a membrane filter having a pore diameter of 0.2 μm.

Each of the photoresist compositions was subjected to the evaluation tests according to the testing procedures described before to give the results shown in Table 1.

COMPARATIVE EXAMPLES 1 TO 3

The formulation of the positive-working photoresist composition in each of these Comparative Examples was just the same as in the above described Examples excepting the use of a novolac resin which was the novolac D, G or K in Comparative Examples 1, 2 and 3, respectively.

The results of the evaluation tests for these compositions are also shown in Table 1.

TABLE 1

|  | Heat resistance °C. | Resolution, μm | Scum formation |
|---|---|---|---|
| Example |  |  |  |
| 1 | 140 | 0.32 | Good |
| 2 | 145 | 0.32 | Good |
| 3 | 140 | 0.35 | Good |
| 4 | 140 | 0.35 | Good |
| 5 | 140 | 0.35 | Good |
| 6 | 145 | 0.32 | Good |
| 7 | 140 | 0.35 | Good |
| 8 | 145 | 0.35 | Good |
| Comparative Example |  |  |  |
| 1 | 130 | 0.42 | Poor |
| 2 | 130 | 0.40 | Poor |
| 3 | 130 | 0.45 | Poor |

What is claimed is:

1. A positive-working photoresist composition which comprises, as a uniform blend:
   (a) an alkali-soluble novolac resin having a weight-average molecular weight in the range from 2,000 to 15,000; and
   (b) from 10 to 40 parts by weight of a quinone diazide group-containing compound per 100 parts by weight of the alkali-soluble novolac resin,
   the alkali-soluble novolac resin being a product by a condensation reaction between a phenolic compound and an aldehyde compound with an acid as the catalyst undertaken in a solvent system comprising γ-butyrolactone or a combination of γ-butyrolactone and a propyleneglycol monoalkyl ether.

2. The positive-working photoresist composition as claimed in claim 1 in which the amount of γ-butyrolactone or a combination of γ-butyrolactone and a propyleneglycol monoalkyl ether in the solvent system is in the range from 10 to 1000 parts by weight per 100 parts by weight of the total amount of the phenolic compound and the aldehyde compound.

3. The positive-working photoresist composition as claimed in claim 1 in which the solvent system contains γ-butyrolactone and a propyleneglycol monoalkyl ether in combination and the amount of γ-butyrolactone is at least 20% by weight based on the total amount of γ-butyrolactone and the propyleneglycol monoalkyl ether.

4. The positive-working photoresist composition as claimed in claim 1 in which the propyleneglycol monoalkyl ether is propyleneglycol monomethyl ether or propyleneglycol monopropyl ether.

5. The positive-working photoresist composition as claimed in claim 1 in which the solvent system further comprises water.

* * * * *